United States Patent [19]

Maurer et al.

[11] Patent Number: 4,464,770
[45] Date of Patent: Aug. 7, 1984

[54] SYNCHRONOUS RADIO OR TELEVISION RECEIVER WITH ANALOG HIGH FREQUENCY SECTION FOLLOWED BY DIGITAL LOW FREQUENCY SECTION

[75] Inventors: Robert Maurer; Georg Frank, both of Saarbrücken, Fed. Rep. of Germany

[73] Assignee: Licentia Patent-Verwaltungs-GmbH, Frankfurt am Main, Fed. Rep. of Germany

[21] Appl. No.: 366,393

[22] Filed: Apr. 7, 1982

[30] Foreign Application Priority Data

Apr. 7, 1981 [DE] Fed. Rep. of Germany ....... 3114063

[51] Int. Cl.³ ............................................. H04L 27/06
[52] U.S. Cl. ..................................... 375/119; 375/81; 375/77; 455/265
[58] Field of Search ................... 375/81, 94, 119, 120, 375/77, 97; 455/260, 265; 329/50, 124

[56] References Cited

U.S. PATENT DOCUMENTS

| | | | |
|---|---|---|---|
| 3,181,122 | 4/1965 | Brown | 375/81 |
| 3,669,511 | 6/1972 | Motley et al. | 375/77 |
| 3,675,131 | 7/1972 | Pickholtz | 375/120 |
| 3,701,948 | 10/1972 | McAuliffe | 375/77 |
| 3,818,347 | 6/1974 | Holsinger | 375/81 |
| 4,100,499 | 7/1978 | Monrolin | 375/81 |

OTHER PUBLICATIONS

Vitorbi, A. J., "Principals of Coherent Communication", McGraw-Hill, New York, 1966, pp. 14–19.
Gupta, S. C.: On Optimum Digital Phase Locked Loops, Southern Methodist University, Dallas, Texas, pp. 340–344.
Herrmann, O., "Transversalfiler zur Hilbert-Transformation", Archiv Der Elektrischun Ubertragung (A.E.Ü), Dec. 1969, vol. 23, No. 12, S. Hirzel Verlag, Stuttgart, Federal Republic of Germany.
Ludloff, A., "Zum Stand der Signatverarbeitung bei Rundsuchradars", NTZ, vol. 29, No. 9, (1976), pp. 647–651.
Ludloff, A., "Probleme der Radarsignalverarbeitung bei Pulskompression mittels Phasenumtastung", Symposium on Radar Technique, 1972, Düsseldorf, Library of DGON, No. 106, pp. 265–283.

Primary Examiner—Jin F. Ng
Attorney, Agent, or Firm—Spencer & Frank

[57] ABSTRACT

A synchronous receiver comprising a high frequency section realized by analog components, including an input preamplifier followed by two quadrature operated mixers with associated $\pi/2$ phase shifter and a voltage controlled oscillator wherein the high frequency signal is converted by multiplication by means of a phase locked loop directly into the base band and lowpass filters following the mixers for select out interfering mixed products, and a low frequency section following the high frequency section. The receiver is used as a radio or television receiver and the low frequency section is realized by digital components.

12 Claims, 8 Drawing Figures

FIG. 5 PRIOR-ART

SYNCHRONOUS RADIO OR TELEVISION RECEIVER WITH ANALOG HIGH FREQUENCY SECTION FOLLOWED BY DIGITAL LOW FREQUENCY SECTION

BACKGROUND OF THE INVENTION

The present invention relates to a receiving system, comprising a high frequency section followed by a low frequency section, and wherein the high frequency section is realized in analog technique, whereas the low frequency section is realized in digital technique. The high frequency section includes an input preamplifier followed by two quadrature actuated mixers, with associated $\pi/2$ phase shifter and voltage controlled oscillator, wherein the high frequency signal is directly converted into the base band by multiplication by means of a phase locked control loop, and respective lowpass filters connected to the outputs of the mixers to select out interfering mixed products.

Figure 1:
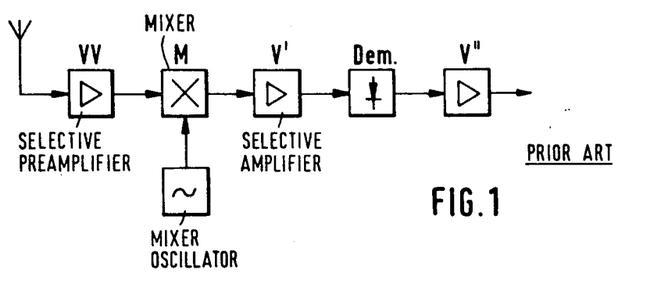
FIG. 1 is a block circuit diagram of a superheterodyne receiver according to the prior art.

Present-day receivers for radio and television are based on the structure of the superheterodyne receiver whose block circuit diagram is shown in FIG. 1. The received signal is fed to a mixer M via a selective low-noise preamplifier VV whose center frequency is variable, and is converted to a constant intermediate frequency. Thereafter the actual frequency selection is made in the further selective amplifier V', the selected signal is demodulated in a demodulator Dem, and the demodulated signal is amplified in the amplifier V''. This receiver concept requires a very constant-frequency mixing oscillator and highly selective bandpass filters, which are expensive to tune, in the amplifier for the frequency selection. For a long time, this process has been adapted to technological advances and has now reached a high degree of development.

MARGINAL CONDITIONS IN DIGITAL SIGNAL PROCESSING

Digital signal processing systems operate with quantized, digitalized sampling values of a time function. The form of the sampling pulses is here of decisive importance with respect to undesirable distortions in the spectrum of the sampled function. In the ideal case, the sampling function is a periodic sequence of Dirac pulses. The sampled signal can then be defined as follows:

$$x_a(t) = \sum_{\nu=-\infty}^{\infty} x(\nu \cdot T_o) \cdot \partial(t - \nu T_o).$$

The Fourier transform of this signal is $$x_a(j\omega) = \omega_o \sum_{\nu=-\infty}^{\infty} x(j\omega - j\nu\omega_o); \omega_o = \frac{2\pi}{T_o}.$$

The sampling frequency is here $f_0 = 1/T_0$. The representation of the Fourier transform indicates that each sampling produces a periodic repetition of the original spectrum. At the same time, the frequency position of a signal can also be changed. With respect to the bandwidth B, the sampling frequency must meet the following condition:

$$\omega_o \geq 2B$$

A violation of this relationship, known as the sampling theorem, produces overlapping of the individual spectral components of the sampled function, so that the original time function can then no longer be reconstructed. Therefore every signal must be limited in bandwidth before it is sampled.

Real sampling with a sample and hold circuit results in a periodic repetition of the original spectrum distorted with $$\frac{\sin \frac{\omega T}{2}}{\frac{\omega T}{2}} \cdot e^{-j\omega T/2}$$

The then occurring time delay must be considered in the construction of digital control circuits so as not to endanger stability. Moreover, fluctuations in the duration T of the sampling interval (closing errors) cause additional amplitude distortions.

Therefore, high demands must be placed on the precision of the sampling process and on the limit or cut-off frequency of the participating components. Total digitalization of a receiver is thus rather meaningless.

STRUCTURES OF ASYNCHRONOUS DIGITAL RECEIVERS

The Digital Version of a Superheterodyne Receiver

Figure 2:
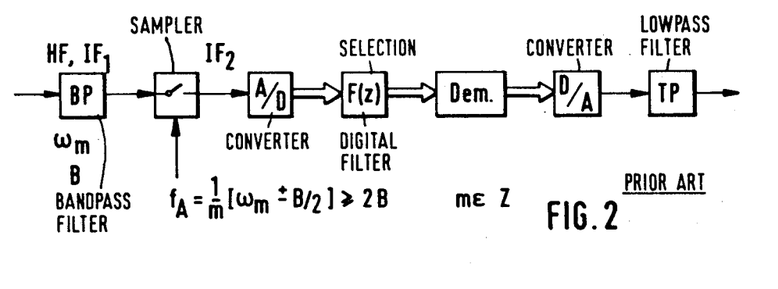
FIG. 2 is a block circuit diagram of a known digital version of a superheterodyne receiver.

The block circuit diagram of FIG. 2 has a structure corresponding to a superheterodyne receiver. A broad received band is preselected in the high frequency plane (HF) or in the intermediate frequency plane (IF) by means of analog bandpass filters. Corresponding to the broadband preselection, the subsequent sampling requires a high sampling rate. Simultaneous down conversion into a new intermediate frequency plane (IF$_2$) can be effected together with the sampling. The actual useful signal is selected digitally by means of a digital bandpass filter F(z). Thus the difficult matching process for conventional bandpass filters is eliminated. Depending on the degree of filtering and in conjunction with the wide bandwidth of the only weakly selected input signal, the thus realizable high selectivity requires extremely fast digital modules. The concept is thus not adapted to technological facts.

Demodulation can be effected, for example in the case of an amplitude modulated signal, by a simply realized formation of the absolute value of the signal and subsequent digital lowpass filtering, with the method customary in the analog case being digitalized for the demodulation.

In addition to the high sampling rate and calculating speed, this system has the further drawback that mismatching between carrier frequency and center frequency of the bandpass filter causes distortions in the demodulated signal—as discussed below.

Figure 3:
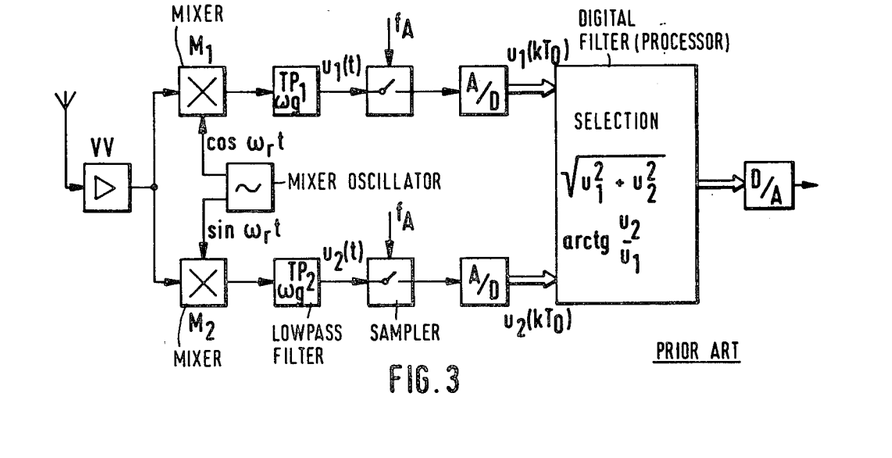
FIG. 3 is a block circuit diagram of a possible asynchronous hybrid receiver with analog to digital conversion in the base band.

Asynchronous Digital Receiver with Analog-Digital Conversion In the Base Band Asynchronous reception with demodulation in the base band (IF=0) requires the simultaneous down conversion with the aid of two orthogonal signals. The structure of this receiver, shown in FIG. 3, is known.

Let it be assumed that the input signal is:

$$x_1(t) = a_1(t) \cdot \cos(\omega_T t + \phi(t)).$$

After multiplication in the respective mixers M$_1$ and M$_2$ the result is:

$$x_c(t) = a_0 \cdot \cos(\omega_T t + \Delta\omega t + \phi_1(t))$$

$$x_s(t) = a_0 \cdot \sin(\omega_T t + \Delta\omega t + \phi_1(t))$$

and after lowpass filtering in lowpass filters TP$_1$ and TP$_2$ respectively in which the components at double the carrier frequency are eliminated and the bandwidth of the mixed product is limited to the bandwidth permitted in the subsequent sampling, there result the two signals $$u_1(t) = k_m \frac{a_0}{2} a_1(t) \cdot \cos(\Delta\omega t + \phi_1(t) - \phi(t))$$

$$u_2(t) = k_m \frac{a_0}{2} a_1(t) \cdot \sin(\Delta\omega t + \phi_1(t) - \phi(t)).$$

$\Delta\omega$ considers the case in which the carrier frequency does not exactly coincide with the frequency of the mixer oscillator. These two signals sampled at times $k \cdot T_0$ in respective samplers can be limited to the exact signal bandwidth in the digital portion of the receiver (selection). With frequency offset, the components of the signal spectrum originating from the upper and lower sideband are filtered differently, causing amplitude and phase distortions in the demodulated signal which can no longer be reversed. However, as long as the filtering, described by convolution with the weighting function $h(kT_0)$ of the digital filter, does not touch the two signals $u_1$ and $u_2$, due to frequency offset, i.e. as long as $$u_1(kT_o)*h(kT_o) =$$

$$k_m \frac{a_0}{2} a_1(kT_o) \cdot \cos(\Delta\omega T_o + \phi_1(kT_o) - \phi(kT_o))$$

$$u_2(kT_o)*h(kT_o) =$$

$$k_m \frac{a_0}{2} a_1(kT_o) \cdot \sin(\Delta\omega kT_o + \phi_1(kT_o) - \phi(kT_o))$$

is met, the conventional envelope curve of the input signal can be obtained by calculating $$p(kT_o) = +\sqrt{u_1^2(kT_o) + u_2^2(kT_o)} = k_m \frac{a_0}{2} |a_1(kT_o)|$$

Demodulation of an angle modulated signal is effected under the same marginal conditions by calculation of $$\Phi(kT_o) = \arctan \frac{u_2(kT_o)}{u_1(kT_o)} = \Delta\omega kT_o - \phi(kT_o) + \phi_1$$

$$\dot{\Phi}(kT_o) = \Omega(kT_o) = \Delta\omega - \dot{\phi}(kT_o) + \dot{\phi}_1(kT_o)$$

The momentary phase $\phi(kT_0)$ is falsified by the phase noise $\phi_1$ of the mixer oscillator and, with frequency offset, by a constantly increasing term which causes, inter alia, difficulties regarding the limited value range. The momentary frequency $\Omega$ is obtained by differentiating the momentary phase. It is falsified by $\Delta\omega - \dot{\phi}_1$. Missing synchronism and phase noise of the mixing oscillator also cause considerable problems.

Figure 4:
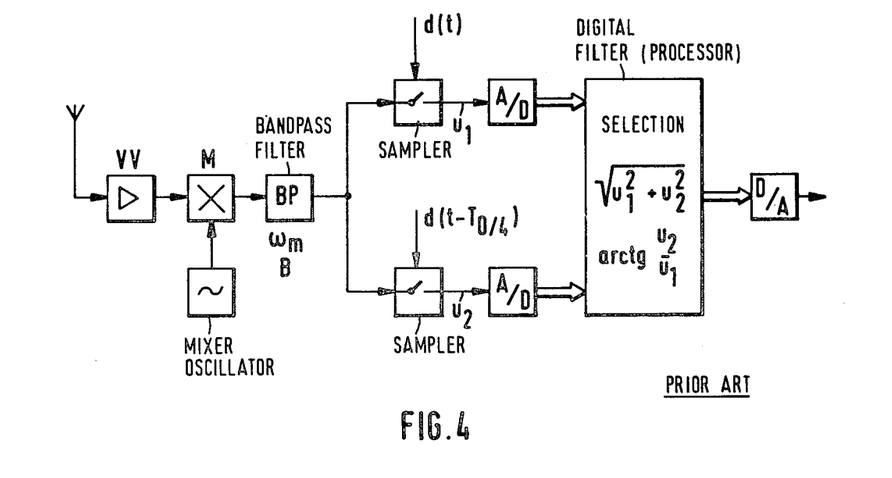
FIG. 4 is a block circuit diagram of a further known embodiment of an asynchronous hybrid receiver with analog to digital conversion in the base band.

A further realization of the asynchronous hybrid receiver is shown in FIG. 4. In this embodiment, the down conversion with two orthogonal harmonic signals is no longer required. Instead, the received signal is mixed in mixer M, preselected in the intermediate frequency plane in a bandpass filter BP, and then sampled in respective samplers with two pulse sequences which are shifted in time (by one quarter of a clock pulse duration). The sampling produces a simultaneous down conversion into the base band at the intermediate frequency of zero, if the sampling rate is selected to be $$r = \frac{\omega_m}{m} \geq 2B \quad m\epsilon \quad \mathbb{Z}$$

To assure orthogonality of the two signals $u_1$ and $u_2$, m must additionally be selected to be odd. The further design corresponds to the structure shown above in FIG. 3 and thus causes the same difficulties.

DIRECT MIXING SYNCHRONOUS RECEIVER

The principle of a synchronous receiver will be explained with the aid of FIG. 5. The significant component of this system is a phase locked loop (PLL) with which a voltage controlled oscillator (VCO) is synchronized in frequency and phase with a signal to be received. The synchronized output signal of the oscillator VCO is fed to a mixer M$_1$ and with a 90° phase shift to a mixer M$_2$, the mixers M$_1$ and M$_2$ also receive the input signal and with this synchronized signal from the voltage controlled oscillator VCO, the received signal is directly converted to the base band in the mixers M$_1$ and M$_2$, while circumventing the IF plane, and is synchronously demodulated. A subsequent demodulator, as required for example in the superheterodyne receiver or in the receiver of FIG. 4, is thus no longer necessary. The synchronous demodulation results in a lower threshold value.

If the noise affected input signal is expressed as follows:

$$x_1(t) + n(t) = a_1(t) \cdot \sin(\omega_T t + \phi_T) + n(t)$$

and the signal from the oscillator VCO as $$x_o(t) = a_o \cdot \cos(\omega_o t + \phi_o),$$

where the phase $\phi_0(t)$ is given by the relationship $$\phi_o(t) = k_o \int_0^t y(\tau)d\tau$$

there results the following known differential equation for the phase locked control loop (see Viterbi, A. F., "Principles of Coherent Communication", McGraw-Hill, New York, 1966, pgs. 14–19):

$$\frac{d\Phi}{dt} = -k_o \left( k_m \frac{a_1 a_2}{2} \cdot \sin(\Delta\omega t + \Phi) + n'(t) \right) *h(t) + \frac{d\phi_T}{dt}$$

$$\Phi = \phi_T - \phi_o$$

$$\Delta\omega = \omega_T - \omega_o$$

The phase-locked loop (PLL) has the characteristic of automatically regulating a certain range of the mismatch $\Delta\omega$ and maintaining the once reached synchronous state. In the synchronous state $\Delta\omega = 0$ and with a small phase error $\Phi(t)$, the sine function can be replaced by its argument. From the resulting linear differential represents the hybrid design of a synchronous homodyne receiver with a high frequency section (preamplifier, mixer, voltage controlled oscillator, phase shifter) realized in the analog technique and a low frequency section (loop filter, output lowpass filter, gain control) realized digitally. Such a circuit is shown in and will be explained with the aid of FIG. 6.

Figure 6:
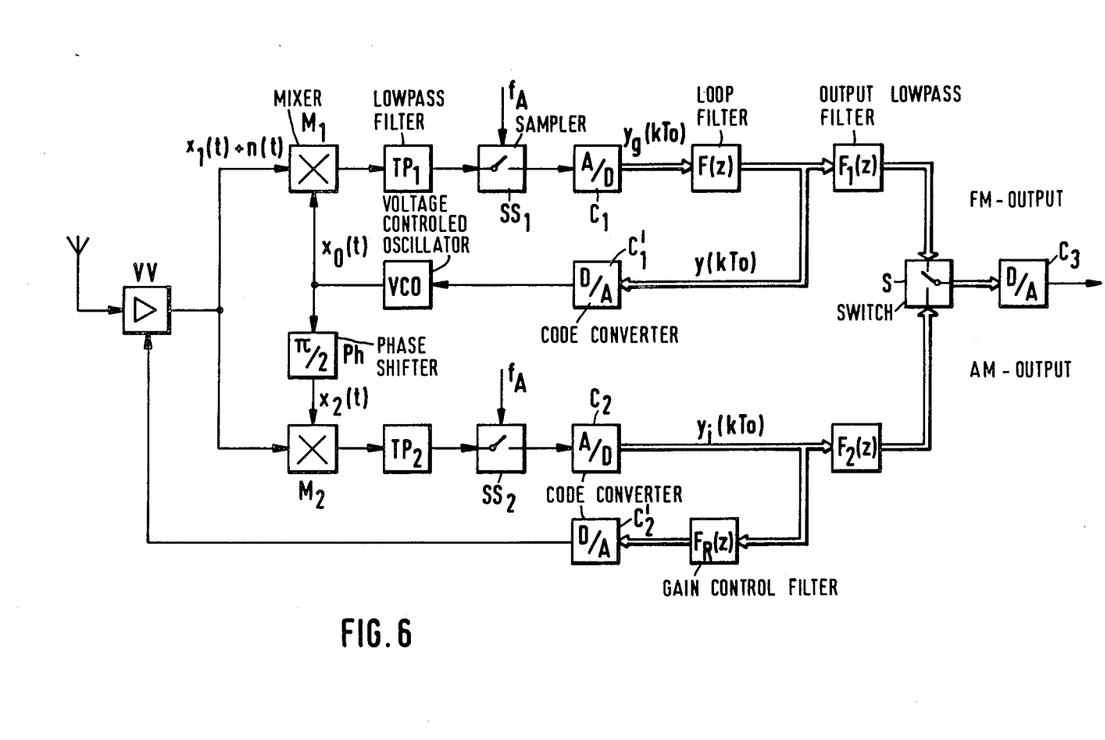
FIG. 6 is a block circuit diagram of a direct mixing synchronous hybrid receiver according to one embodiment of the invention for amplitude or angle modulated signals.

As shown in FIG. 6, the input signal is fed to a preamplifier VV, whose output is split into two branches. The one branch shown at the top of the drawing figure comprises the mixer $M_1$ followed by the lowpass filter $TP_1$ and the subsequent module for signal sampling $SS_1$ at the sampling frequency $f_A$. The output of this stage SS leads to an analog-digital converter $C_1$ whose output signal is fed to a digital loop filter $F(z)$. The output of this loop filter $F(z)$ leads both to the associated digital output lowpass filter $F_1(z)$ and, via a digital-analog converter $C'_1$, to the voltage controlled oscillator VCO, whose output signal $x_0(t)$ is fed to the mixer $M_1$ where it is multiplied (mixed) with the input signal $X_1(t)+n(t)$. At the same time, the output signal of the oscillator VCO is conducted through a phase shifter Ph which produces a $\pi/2$ phase shift and whose output signal $x_2(t)$ is fed to the mixer $M_2$.

The other branch at the output side of the preamplifier VV comprises the mixer $M_2$ followed by a lowpass filter $TP_2$. The signal selected by this lowpass filter $TP_2$ leads to a sampling circuit $SS_2$ which samples the existing signal at the frequency $f_A$.

The output of this sampling circuit $SS_2$ leads to an analog-digital converter $C_2$ whose output signal $y_i(kT_0)$ is fed to a digital output lowpass filter $F_2(z)$. The last-mentioned signal, i.e. the signal at the output of the converter $C_2$, simultaneously serves for the gain control, represented by the filter stage $F_R(z)$, whose output signal, after conversion in a digital-analog converter $C'_2$ is fed, in the illustrated embodiment, to the preamplifier VV.

It should be pointed out already at this point, that this control signal can, if desired, also be fed to the voltage controlled oscillator VCO or to the two lowpass filters $TP_1$ and $TP_2$.

From the signals present at the two digital output lowpass filters $F_1(z)$ and $F_2(z)$, respectively, the desired amplitude or frequency modulated signal can be selected via a switch S and can be reconverted into the analog low frequency signal via a subsequent digital-analog converter $C_3$.

The system behavior of this linearized analog-digital (hybrid) phase locked loop (PLL) in the receiving system according to FIG. 6 can be illustrated in the Laplace region as well as with the use of the Z transform. The determination of the optimum digital loop filter $F(z)$ according to Wiener's optimum filter theory indicates that under consideration of the time delay caused by the sampling and the digital conversion, the optimum digital loop filter has a higher degree than in the corresponding analog case (see Gupta, S. C., "On Optimum Digital Phase-Locked Loops", IEEE Transactions on Communications Technology, Vol. COM-16, pages 340-344, April, 1968).

This novel receiver concept according to FIG. 6 can be characterized as follows:

The synchronous technique utilizing a phase locked loop assures a correct phase, synchronous down conversion of the received signal into the base band.

There is no intermediate frequency and thus there arise no problems with the image frequency (image frequency is equal to received frequency).

No preselection is required. The band limitation takes place in the base band by means of the lowpass filters $TP_1$, $TP_2$ following the mixers $M_1$, $M_2$. The bandwidth of the lowpass filters is determined by the sampling frequency.

A further band limitation is produced by the transfer function of the phase locked loop.

The output signal of the voltage controlled oscillator VCO must be very poor in harmonics so as to prevent multiple reception if there is no preselection. The mixers must operate without distortion over a wide dynamic range as discussed, for example, in pending U.S. patent application Ser. No. 115,213, filed Jan. 25th, 1980 by R. Maurer et al., now U.S. Pat. No. 4,408,351, issued Oct. 4, 1983. The synchronous demodulation permits lower threshold values than do conventional demodulators.

The analog technique is the only technology available for the design of system components required to process high frequency signals, such as the controllable preamplifier VV, mixers, $M_1$ and $M_2$, voltage controlled oscillator VCO and phase shifter Ph. By moving the sampling into the base band, the high frequency selective prefiltering is eliminated.

The digital realization of the low frequency section requires spectral limitation of the input signal before sampling and an analog-digital conversion. The resulting phase errors must be considered in the selection of the digital loop filter.

The use of digital systems is principally limited to the low frequency range. The limit frequency, however, slowly goes higher due to technological advances so that in the forseeable future, processing of the FBAS television signal will also be possible. Digital processing permits complete integration.

The characteristics of the digital low frequency section (filtering, control) can be programmed.

No tolerance problems occur in mass production, and tuning work is not required.

Full drivability is limited. It is determined by the kind of number representation and the number of quantizing levels. Therefore it is necessary to have a gain control in the analog section.

The general basic circuit of FIG. 6 is suitable for the reception of amplitude modulated signals as well as for the reception of angle modulated signals. However, the phase-locked loop (PLL) included in the basic structure must be specialized, i.e. programmed, for each respective use. In the case of double sideband amplitude modulated signals with carrier, the PLL must be designed to be so narrow banded that it synchronizes only with the possibly noise affected carrier (narrowband PLL). The synchronously demodulated useful signal is available in the in-phase branch. Selection is effected by means of the output lowpass filter $F_2(z)$.

Frequency modulated signals require a broadband PLL in the circuit of FIG. 6. The loop filter $F(z)$ and the static loop amplification must be dimensioned in such a way that the phase locked loop is able, on the one hand, to regulate the maximum frequency rise and, on the other hand, the useful signal is demodulated without distortion over its entire bandwidth. The output signal $y(kT_0)$ is available in the quadrature branch. A lowpass filter $F_1(z)$ whose limit frequency is equal to the highest equation, the lowpass transfer function of the linearized PLL can be derived as follows:

$$H(s) = \frac{\phi_o(s)}{\phi_T(s)} = \frac{\omega_s F(s)}{s + \omega_s F(s)}$$

wherein $$\omega_s = \frac{a_1 a_o}{2} k_m \cdot k_o$$

is the static loop gain of the PLL which depends upon the input level $a_1$. The dependence upon the input level requires a regulation of the loop gain so as to assure defined system behavior and stability of the PLL (see U.S. application Ser. No. 104,021 filed Dec. 17th, 1979 by R. Maurer et al, now U.S. Pat. No. 4,387,410 issued June 7, 1983).

Between the control signal y(t) of the oscillator VCO and the phase of the input signal and under consideration of the noise n'(t), the following relationship can be stated.

$$y(s) = \frac{1}{k_o} \cdot s \cdot H(s) \cdot \phi_T(s) + \frac{1}{\omega_s} \cdot s \cdot H(s) \cdot N'(s)$$

If $\phi_T(t)$ constitutes the phase of a carrier frequency modulated with the signal v(t), then, because of $$\phi_T(s) = \Delta\Omega(1/s) \cdot V(s)$$

the demodulation behavior of the PLL will be $$y(s) = \frac{\Delta\Omega}{k_o} \cdot H(s) \cdot V(s) + \frac{s}{\omega_s} H(s) \cdot N(s).$$

If the bandwidth of the transfer function H(s) is selected to be sufficiently large, the demodulated signal y(t) is composed of a component which is directly proportional to the modulating signal v(t) and of a noise component. To limit this noise component, it is necessary to limit the band at the output by means of a filter $T_1(s)$.

With the 90° phase shifted signal $x_2(t)$ from oscillator VCO, i.e.

$$x_2(t) = a_o \cdot \sin(\omega_o t + \phi_o)$$

it is possible to synchronously demodulate the carrier amplitude $a_1(t)$. After lowpass filtering in filter $TP_2$ to eliminate the components at twice the carrier frequency, the product of the signals $x_1$ and $x_2$ yields the signal $$y_i(t) = \frac{k_m a_o}{2} \cdot a_1(t) \cdot \cos\phi(t) \sim a_1(t), \; V|\phi| < < 1.$$

which, for small phase errors, is directly proportional to the carrier amplitude. In the case of an amplitude modulated signal, this product is also the demodulated information. $Y_i(t)$ is used for the automatic gain control and thus to regulate the loop gain. The regulating filter $F_R(s)$ must here be selected to be so narrowbanded that the time constant of the gain regulation is greater by at least the factor 10 than the time constant of the phase locked control loop.

SUMMARY OF THE INVENTION

It is the object of the present invention to provide a receiving system with digital signal processing in which there occurs no intermediate frequency (IF) and the high frequency section as well as the low frequency section of the receiving system are each realized in the optimum manner.

The above object is achieved according to the present invention by the fact that in a synchronous receiver, comprising a high frequency section followed by a low frequency section, the high frequency section is realized by analog components, whereas the low frequency section is realized by digital components. In the synchronous receiver the high frequency input signal is converted by multiplication directly into the base band using a phase-locked loop. Intermediate frequency components are not necessary and they are therefore omitted. The high frequency section consists of an input preamplifier, first and second quadrature operated multiplying mixers each having one input connected to the output of the preamplifier, a voltage controlled oscillator having its output connected directly to a second input of the first mixer and connected via a $\pi/2$ phase shifter to a second input of the second mixer and having its control input connected to a point in the branch of the receiver circuit containing the first mixer, and first and second lowpass filters, for selecting out interfering mixed products, connected to the outputs of the first and second mixers. The receiver is a radio or television receiver and the low frequency section is realized by digital components.

Various specific embodiments of such a receiver for use with received high frequency signals with different type modulation are disclosed.

DETAILED DESCRIPTION OF THE PREFERRED EMBODIMENTS

Figure 5:
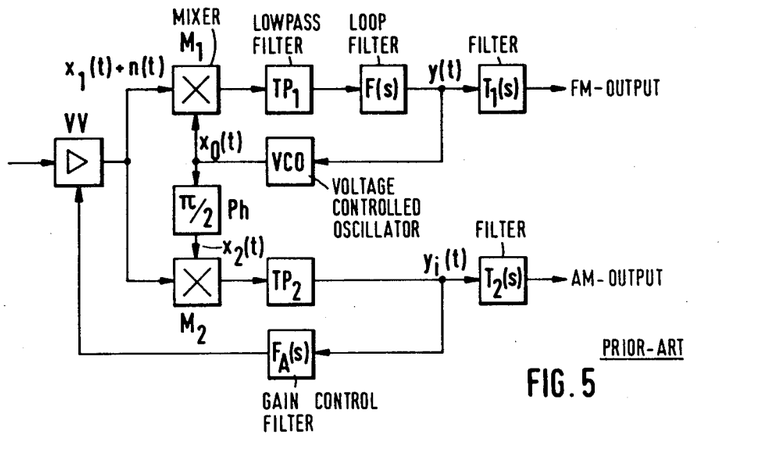
FIG. 5 is a block circuit diagram of a direct mixing synchronous receiver according to the prior art.

The structure of the prior art direct mixing, synchronous receiver of FIG. 5 can be divided into a high frequency section and a separate low frequency section. The novel receiving system according to the invention low frequency of the demodulated useful signal, serves to optimize the noise.

Phase modulated signals with low phase deviation are demodulated in a narrowband phase locked loop (PLL). The limit frequency of the transfer function of the PLL must be lower than the lowest useful frequency. The demodulated signal is obtained before it reaches the loop filter F(z).

Figure 7:
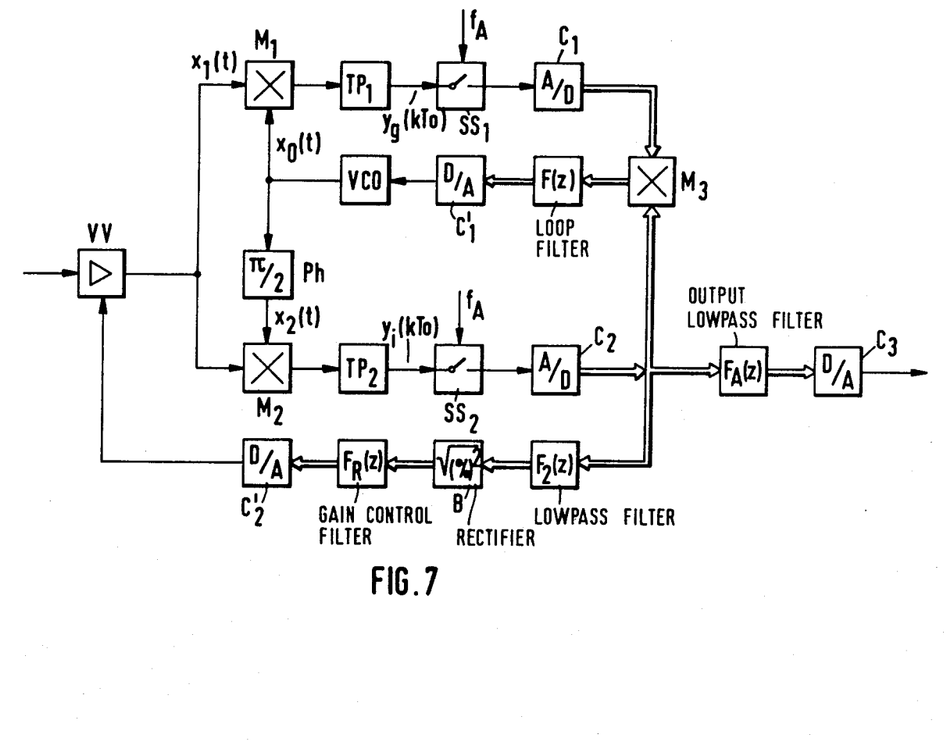
FIG. 7 is a block circuit diagram of a direct mixing synchronous hybrid receiver according to another embodiment of the invention for phase shift keyed (PSK) and double sideband transmitted signals without carrier.

Double sideband amplitude and 2-PSK (phase shift keyed) modulated signals can be represented as follows $$x_1(t) = v(t) \cdot \sin(\omega_T t + \phi_T)$$

where v(t) is a time function free of average. The transmitting signal thus has no carrier. A synchronous receiver structure suitable for the reception of such signals is shown in FIG. 7.

The input signal fed to the preamplifier VV is again divided into two branches at the output of the amplifier VV. The one branch, as in the circuit described in connection with FIG. 6, comprises the series connection of a mixer $M_1$, a low-pass filter $TP_1$ and a sampling circuit $SS_1$ followed by an analog-digital converter $C_1$. The output signal of this converter $C_1$ is now fed to the one input of a further mixer $M_3$.

The second branch comprises, analogously to the circuit of FIG. 6, the series connection of a mixer $M_2$, a lowpass filter $TP_2$, a sampling circuit $SS_2$ followed by an analog-digital converter $C_2$ which leads to a second input of the above-mentioned mixer $M_3$. The output of the mixer $M_3$ is connected with the required loop filter F(z) whose output signal is fed to a digital-analog converter $C'_1$ which in turn feeds the voltage controlled oscillator VCO. The output of the oscillator VCO leads, on the one hand, with its output signal $x_0$ directly to the mixer $M_1$ and, on the other hand, via a phase shifter Ph which effects a shift in phase by $\pi/2$, to the mixer $M_2$.

The output of the analog/digital converter $C_2$ of the second branch (or of the analog-digital converter $C_1$) is connected with an output lowpass filter $F_A(z)$ which in turn emits the desired analog low frequency signal via a digital-analog converter $C_3$.

The control information for the gain control is obtained in that the output signal $y_i$ of the second branch, after passing through a lowpass filter $F_2(z)$, is rectified by formation of the average value in circuit B. In the illustrated embodiment, this signal travels through the the control filter $F_R(z)$ and the digital-analog converter $C'_2$ to the preamplifier VV.

The two quadrature signals converted down to the base band are $$y_q(t) = k_m \frac{a_0}{2} \cdot v(t) \cdot \sin \Phi$$

$$y_i(t) = k_m \frac{a_0}{2} \cdot v(t) \cdot \cos \Phi$$

After further multiplication and lowpass filtering, the signal $$z(t) = \left(k_m \frac{a_0}{2}\right)^2 v^2(t) \ast h(t) \cdot \sin 2\Phi$$

is available. It is no longer dependent on the sign of the function v(t). The Costas loop structure receives the information required for synchronous demodulation via center frequency and phase position from the sidebands.

Figure 8:
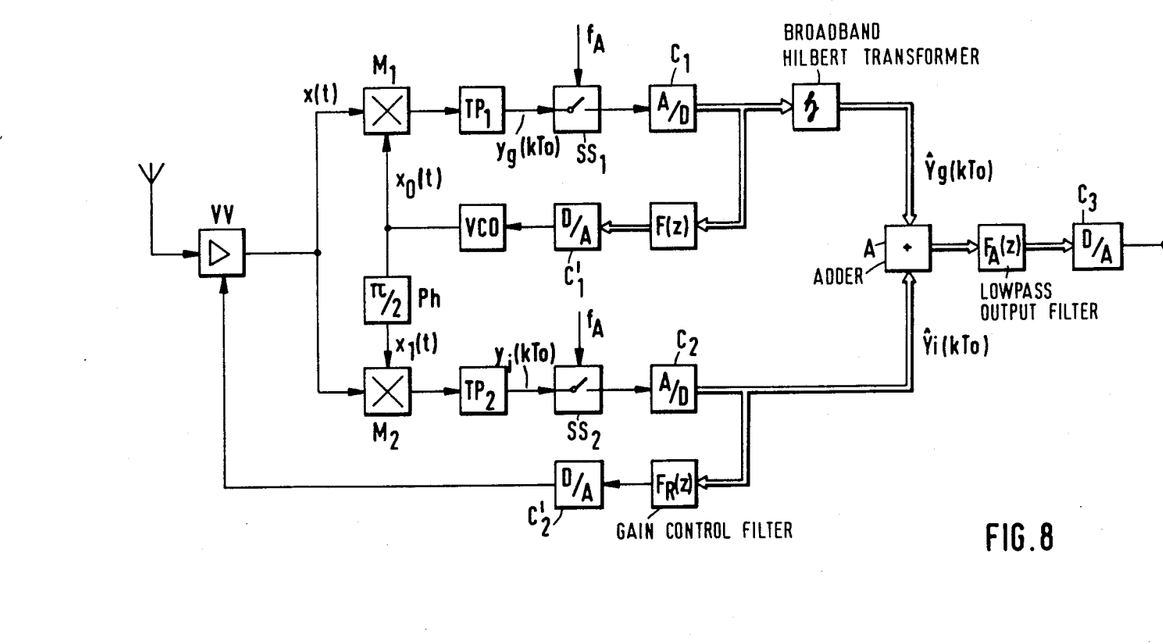
FIG. 8 is a block circuit diagram of a direct mixing synchronous hybrid receiver according to another embodiment of the invention for residual sideband and single sideband transmitted signals with carrier.

A synchronous hybrid receiver according to the invention can also be used for residual and singlesideband signals with carrier. Residual sideband signals with carrier can be expressed as follows:

$$x(t) = s_{ZSB} + x_{ESB} + x_{tr} = (v(t) \cdot \cos\omega_0 t)_{ZSB} + \tfrac{1}{2}(s(t) \cdot \cos\omega_0 t \pm$$

$$\hat{s}(t) \cdot \sin\omega_0 t)_{ESB} + a_1 \cdot \cos\omega_0 t$$

where $$\hat{s}(t) = \zeta(s(t))$$

is the Hilbert transform. The plus sign represents the upper sideband, the minus sign represents the lower sideband. Multiplication of this signal with the two orthogonal signals from the voltage controlled oscillator VCO (assuming a phase error $\Phi = 0$)

$$x_0 = a_0 \cdot \sin \omega_0 t$$

$$x_1 = a_0 \cdot \cos \omega_0 t$$

after lowpass filtering, furnishes the following result:

$$y_i(t) = \frac{a_1 a_0}{2} + v(t)\frac{a_0}{2} + s(t)\frac{a_0}{4}$$

$$y_q(t) = \pm \hat{s}(t)\frac{a_0}{4}.$$

For the sake of simplicity, the converter constant $k_m = 1$ is used. If now $y_q(t)$ is Hilbert transformed as follows:

$$\hat{y}_q(t) = \zeta(\pm \hat{s}(t)) = \mp s(t),$$

the upper sideband can be eliminated by the addition of $y_i$ and $y_q$, while a lower sideband is transmitted with the same power amplification as the double sideband signal. With substraction, the upper sideband remains intact and the lower sideband becomes zero.

A circuit suitable for this purpose is shown in FIG. 8. Here again, the input signal is divided into two branches after suitable preamplification in the preamplifer VV. The one branch includes the series connection of a mixer $M_1$ with a lowpass filter $TP_1$, a sampling circuit $SS_1$ for sampling at a frequency $f_A$ followed by an analog-digital converter $C_1$. The output of the A/D converter $C_1$ leads to a broadband Hilbert transformer $\zeta$ and simultaneously, via a loop filter F(z) and a digital-analog converter $C'_1$ to a voltage controlled oscillator VCO. The output signal $x_0$ of the oscillator VCO is fed to the mixer $M_1$ and simultaneously to a phase shifter Ph which performs a shift in phase of $\pi/2$ and whose output signal $x_1$ is fed to the mixer $M_2$. This mixer $M_2$ forms the second branch together with the subsequent lowpass filter $TP_2$, the scanning device $SS_2$, and the subsequent analog-digital converter $C_2$. The digital output signal $\hat{Y}_i(kT_0)$ of the converter $C_2$ together with the output signals $\hat{Y}_g(kT_0)$ of the Hilbert transformer are fed to an adder A whose output is connected to a common output lowpass filter $F_A(z)$ which in turn leads to the subsequently connected digital-analog converter $C_3$. The desired analog low frequency signal can be obtained at the output of this digital-analog converter $C_3$.

The required gain control is formed by the control loop connected to the common connection of the A/D converter $C_2$ and the adder A and comprises the control unit or filter $F_R(z)$ followed by the digital-analog converter $C'_2$. In the illustrated embodiment the then obtained control signal is fed to the preamplifier VV.

As already described in connection with FIG. 6, the gain control signal in the circuit of FIG. 7 and also in the circuit of FIG. 8 may be fed, in deviation therefrom, either to the voltage controlled oscillator VCO or simultaneously to the two lowpass filters $TP_1$ and $TP_2$.

The receiver structure of FIG. 8 is able to synchronously demodulate single sideband and residual sideband signals (e.g. television signals). With the inclusion of a broadband phase shifter (real Hilbert transformer) having the bandwidth of the single sideband signal, the undesirable sideband can be suppressed without performing a single sideband filtering at the high frequency side. Algorithms for the digital Hilbert transformation are known, (see for example, Herrmann, O., "Transversal Filter for the Hilbert Transformation", A.E.U., Vol. 23 (1969), pages 581–587), but require complicated calculations depending on the accuracy required and on the ratio of upper to lower limit or cut-off frequency.

It will be understood that the above description of the present invention is susceptible to various modifications, changes and adaptations, and the same are intended to be comprehended within the meaning and range of equivalents of the appended claims.

What is claimed is:

1. A synchronous radio or television receiver for received phase shift keyed signals without a carrier and double sideband signals without carrier wherein the high frequency input signal is converted by multiplication directly into the base band using a phase locked loop, and wherein the receiver has a high frequency section followed by a low frequency section with said high frequency section being realized by analog components and said low frequency section being realized by digital components; said receiver comprising: an input analog preamplifier; first and second quadrature operated multiplying analog mixers each having one input connected to the output of said preamplifier; a voltage controlled oscillator having its output connected directly to a second input of said first mixer and connected via a $\pi/2$ phase shifter to a second input of said second mixer, and having a control input; first and second analog lowpass filters for selecting out interfering mixed products connected to the outputs of said first and second mixers, respectively; first and second sampling means, connected to the outputs of said first and second analog lowpass filters, respectively, for sampling the analog output signals of said first and second lowpass filters at a given sampling frequency; first and second analog to digital converters, connected to the outputs of said first and second sampling means respectively, for converting the respective sampled analog base band signals to digital signals; digital multiplying means for multiplying the output signals of said first and second analog to digital converters; a digital loop filter connected to the output of said multiplying means; a first digital to analog converter connected between the output of said digital loop filter and said control input of said voltage controlled oscillator; a digital output lowpass filter having its input connected to the output of one of said first and second analog to digital converters and its output connected to the input of a second digital to analog converter whose output constitutes the output of said receiver; a further digital lowpass filter having its input connected to the output of said second analog to digital converter; average value forming means connected to the output of said further digital lowpass filter; and a gain control circuit and a further digital to analog converter connected in series between the output of said average value forming means and a component in said high frequency section to said receiver.

2. A receiver as defined in claim 1 wherein said input of said digital output lowpass filter is connected to said output of said second analog to digital converter.

3. A synchronous radio or television receiver wherein the high frequency input signal is converted by multiplication directly into the base band using a phase locked loop and wherein the receiver has a high frequency section followed by a low frequency section with said high frequency section being realized by analog components and said low frequency section being realized by digital components; said receiver comprising: an input analog preamplifier; first and second quadrature operated multiplying analog mixers each having one input connected to the output of said preamplifier; a voltage controlled oscillator having its output connected directly to a second input of said first mixer and connected via a $\pi/2$ phase shifter to a second input of said second mixer, and having a control input; first and second analog lowpass filters for selecting out interfering mixed products connected to the outputs of said first and second mixers, respectively; first and second sampling means, connected to the outputs of said first and second analog lowpass filters, respectively, for sampling the analog output signals of said first and second lowpass filters at a given sampling frequency; first and second analog to digital converters, connected to the outputs of said first and second sampling means respectively, for converting the respective sampled analog base band signals to digital signals; a digital loop filter connected to the output of said first analog to digital converter; first and second digital output lowpass filters connected to the outputs of said digital loop filter and said second analog to digital converter, respectively; switching means for selectively connecting the output of one of said first and second output lowpass filters to the input of a first digital to analog converter whose output is the output of said receiver; a gain control circuit, including the series connection of a digital gain control filter and a second digital to analog converter, connected between the output of said second analog to digital converter and a component in said high frequency section of said receiver; and a third digital to analog converter connected between the output of said digital loop filter and said control input of said voltage controlled oscillator to complete the phase locked loop.

4. A receiver as defined in claim 3 wherein said component to which said gain control circuit is connected is said input preamplifier.

5. A receiver as defined in claim 3 wherein said component to which said gain control circuit is connected is said voltage controlled oscillator.

6. A receiver as defined in claim 3 wherein said component to which said gain control circuit is connected is said first and second analog lowpass filters.

7. A receiver as defined in claim 3 for double sideband amplitude modulated signals with carrier, wherein the phase locked loop is sufficiently narrowbanded that it synchronizes only with said carrier, and the synchronously demodulated input signal can be obtained at said output of said second digital output lowpass filter.

8. A receiver as defined in claim 3 for frequency modulated input signals wherein: the phase locked loop is dimensioned such that it is able to regulate the maximum frequency rise as well as demodulate the useful signal without distortion over its entire bandwidth; said first digital output lowpass filter has a cut-off frequency equal to the highest low frequency component of the demoulated input signal; and said demodulated input signal is obtainable at said output of said first digital output lowpass filter.

9. A synchronous radio or television receiver for received residual sideband and single sideband signals with a carrier wherein the high frequency input signal is converted by multiplication directly into the base band using a phase locked loop, and wherein the receiver has a high frequency section followed by a low frequency section with said high frequency section being realized by analog components and said low frequency section being realized by digital components; said receiver comprising: an input analog preamplifier; first and second quadrature operated multiplying analog mixers each having one input connected to the output of said preamplifier; a voltage controlled oscillatore having its output connected directly to a second input of said first mixer and connected via a $\pi/2$ phase shifter to a second input of said second mixer, and having a control input; first and second analog lowpass filters for selecting out interfering mixed products connected to the outputs of said first and second mixers, respectively; first and second sampling means, connected to the outputs of said first and second analog lowpass filters, respectively, for sampling the analog output signals of said first and second lowpass filters at a given sampling frequency; first and second analog to digital converters, connected to the outputs of said first and second sampling means respectively, for converting the respective sampled analog base band signals to digital signals; a digital loop filter having its input connected to the output of said first analog to digital converter; a first digital to analog converter connected between the output of said digital loop filter and said control input of said voltage controlled oscillator; a broadband digital Hilbert transformation circuit connected to the output of said first analog to digital converter; a digital adder having two inputs connected respectively to the output of said Hilbert transformation circuit and the output of said second analog to digital converter; a digital output lowpass filter having its input connected to the output of said digital adder and its output connected to the input of a second digital to analog converter whose output constitutes the output of said receiver; and a gain control circuit, including the series connection of a digital gain control filter and a further digital to analog converter, connected between the output of said second analog to digital converter and a component of said high frequency section of said receiver.

10. A receiver as defined in claim 9 wherein said component to which said gain control circuit is connected is said preamplifier.

11. A receiver as defined in claim 9 wherein said component to which said gain control circuit is connected is said voltage controlled oscillator.

12. A receiver as defined in claim 9 wherein said component to which said gain control circuit is connected is said first and second analog lowpass filters.

* * * * *